(12) United States Patent
Matsumura et al.

(10) Patent No.: US 6,846,550 B2
(45) Date of Patent: Jan. 25, 2005

(54) ADHESIVE FILM FOR UNDERFILL AND SEMICONDUCTOR DEVICE USING THE SAME

(75) Inventors: Akiko Matsumura, Ibaraki (JP); Kazuki Uwada, Ibaraki (JP); Naoki Sadayori, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/704,905

(22) Filed: Nov. 12, 2003

(65) Prior Publication Data

US 2004/0096633 A1 May 20, 2004

(30) Foreign Application Priority Data

Nov. 14, 2002 (JP) ..................... P.2002-330422

(51) Int. Cl.⁷ .................. C08G 73/10; C08G 18/00; B32B 3/00
(52) U.S. Cl. ................. 428/209; 428/458; 428/473.5; 428/901; 528/44; 528/45; 528/52; 528/310; 528/322; 257/E21.503
(58) Field of Search ................. 428/209, 901, 428/458, 473.5; 528/44, 45, 52, 310, 322; 257/E21.503

(56) References Cited

U.S. PATENT DOCUMENTS

| 4,353,954 A | * | 10/1982 | Yamaoka et al. | ............ 428/216 |
|---|---|---|---|---|
| 5,916,675 A | * | 6/1999 | Komoto et al. | ......... 428/355 R |
| 6,143,409 A | * | 11/2000 | Komoto et al. | ......... 428/355 R |
| 6,492,484 B2 | * | 12/2002 | Misumi et al. | ............. 528/170 |
| 6,652,688 B2 | * | 11/2003 | Matsumura et al. | .......... 156/64 |
| 2003/0034128 A1 | | 2/2003 | Matsumura et al. | |
| 2003/0068841 A1 | | 4/2003 | Matsumura et al. | |

FOREIGN PATENT DOCUMENTS

| EP | 991306 A1 | * | 4/2000 | ............ H05K/3/38 |
|---|---|---|---|---|
| JP | 2000013025 A | * | 1/2000 | ............ H05K/3/46 |
| JP | 2000204157 A | * | 7/2000 | ............ C08G/73/00 |

* cited by examiner

Primary Examiner—Stephen Stein
(74) Attorney, Agent, or Firm—Sughrue Mion, PLLC

(57) ABSTRACT

An adhesive film for underfill which relaxes the stress formed in the wiring circuit substrate, semiconductor element and electrode parts for connection. The adhesive film is a quickly hardening type, and forms a highly heat resistant sealing resin layer quickly between the wiring circuit substrate and semiconductor element of a semiconductor device.

4 Claims, 2 Drawing Sheets

ADHESIVE FILM FOR UNDERFILL AND SEMICONDUCTOR DEVICE USING THE SAME

FIELD OF THE INVENTION

This invention relates to an adhesive film for underfill, which is used for the sealing when a semiconductor element is mounted in a face down structure on the wiring circuit substrate such as a mother board, daughter board or the like. Also, this invention relates to a semiconductor device sealed with the adhesive film.

BACKGROUND OF THE INVENTION

In recent years, in order to achieve further improvement of the performance of semiconductor devices, a method in which a semiconductor element is made into a face down structure and mounted on the wiring circuit substrate such as a wiring circuit-formed mother board, daughter board or the like (flip chip system, direct chip attach system or the like) is drawing attention. That is, the conventional mounting methods have various problems in terms of their performance, such as a delay of information transfer by the wiring and generation of information transfer error due to cross talk, which occur sometimes when a semiconductor element is mounted on a wiring circuit substrate in a packaged form by making contact from it on the lead frame with a gold wire.

In contrast, in the mounting method of face down system, the surface electrode of a semiconductor element is directly connected to a wiring circuit substrate so that it can provide a thin and light semiconductor device. However, in the method such as a flip chip system, direct chip attach system or the like, a semiconductor element and a wiring circuit substrate each having each own different coefficient of linear expansion are directly connected electrically, so that improvement of reliability of the connected part is an important issue.

For the purpose of resolving such issue, a method has been employed in which reliability of the connection is improved by injecting a liquid thermosetting resin which is called an underfill material into the gap between a semiconductor element and wiring circuit substrate, forming a hardened resin body by hardening this, and thereby distributing the stress concentrated into the electric connection part into said hardened resin body.

However, in order to effect injection of a liquid thermosetting resin into the gap between a semiconductor element and wiring circuit substrate, it is necessary to secure a space for arranging an injection nozzle in the peripheral of the semiconductor element mounting position. Since it becomes difficult to secure such a space as miniaturization and thinning of semiconductor devices progresses, demand has been directed toward the improvement of the liquid resin inflow (underfill) step.

Because of this, a method for producing a semiconductor device using an underfill in a film structure has also been devised. According to such a method which uses a film for underfill, it is necessary to seal the gap between the substrate and chip by melting and hardening the film at the same time with the connection of electrodes. Since this requires bonding conditions of high temperature, high load and long time, there is a possibility of causing damage to the pad and substrate and exerting a bad influence by the residual stress upon the reliability. Thus, there is a demand for an adhesive film for underfill use, which can be used under bonding conditions of lower temperature, lighter load and shorter time.

SUMMARY OF THE INVENTION

An object of the present invention is to provide an adhesive film for underfill use which has excellent relaxation effect for stresses generated in the semiconductor element and wiring circuit substrate and the electrode part for connection and also has excellent reliability of electric connection of the semiconductor element and wiring circuit substrate. In addition, the invention also provides a semiconductor device which uses said adhesive film as a sealing resin layer.

In order to solve the aforementioned problems, the present inventors have carried out various examinations. As a result, the invention has been accomplished by finding that a sealing resin layer which does not show reduction of heat resistance after hardening and has excellent quick hardenability and good flexibility can be obtained when a polycarbodiimide described in the following is used as the film for underfill of a semiconductor device.

Thus, the invention provides an adhesive film for underfill, which comprises a polycarbodiimide which is an aromatic-aliphatic copolymer polycarbodiimide comprising a structural unit represented by the following formula (1):

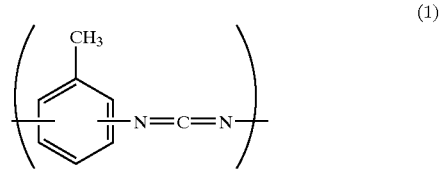

and a structural unit represented by the following formula (2):

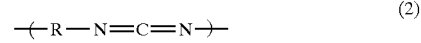

wherein R represents an alkyl group having from 1 to 18 carbon atoms, and a terminal structural unit derived from a monoisocyanate on both termini, wherein the number "m" of the structural unit represented by the formula (1) is an integer of from 2 to 1,000, the number "n" of the structural unit represented by the formula (2) is an integer of from 1 to 500, m+n is from 3 to 1,500, n/(m+n) is from $1/1{,}500$ to $1/3$, and the structural unit of formula (2) does not continue.

BRIEF DESCRIPTION OF THE DRAWINGS

By way of example and to make the description more clear, reference is made to the accompanying drawing in which.

DESCRIPTION OF THE REFERENCE NUMERALS

Figure 1:
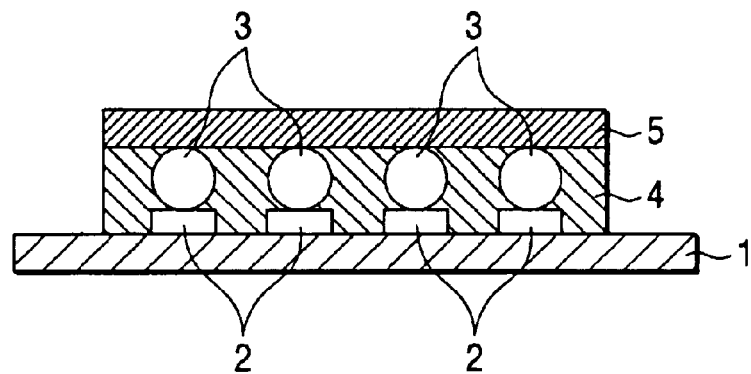
FIG. 1 is a schematic sectional view showing an illustrative example of the semiconductor device of the invention.

1 Wiring circuit substrate
2 Electrode part for connection

3 Electrode part for connection
4 Sealing resin layer
5 Semiconductor element
6 Adhesive film
7 Semiconductor wafer

DETAILED DESCRIPTION OF THE INVENTION

Next, the invention is described further in detail.

The polycarbodiimide to be used in the film of the invention for underfill is an aromatic-aliphatic copolymer polycarbodiimide which has a structural unit derived from diisocyanate and a structural unit derived from an aliphatic isocyanate having from 1 to 18 carbon atoms and also has a structural unit derived from a monoisocyanate on both termini.

The aforementioned polycarbodiimide can be produced from a mixture of a tolylene diisocyanate, an aliphatic chained diisocyanate having from 1 to 18 carbon atoms and a monoisocyanate for controlling the chain length, in an aprotic solvent in the presence of a catalyst.

(Tolylene Diisocyanate)

As the aforementioned tolylene diisocyanate, any of metrically possible isomers may be used, and it may be a mixture of them. Illustratively, 2,3-tolylene diisocyanate, 2,4-tolylene diisocyanate, 2,5-tolylene diisocyanate, 2,6-tolylene diisocyanate, 3,4-tolylene diisocyanate and a mixture comprising two or more of them may be used.

(Aliphatic Chained Diisocyanate)

As a typical example of the aliphatic chained diisocyanate, most easily available hexamethylene diisocyanate may be cited. Other conventionally known aliphatic chained diisocyanate having a carbon chain length of from 1 to 18, such as dodecamethylene diisocyanate and the like, may also be used.

Amount of the aliphatic diisocyanate to be used is from 0.07 to 50 mols, preferably from 5 to 15 mols, based on 100 mols of the aromatic diisocyanate. Heat resistance is reduced when the aliphatic diisocyanate is larger than this range. On the other hand, flexibility of the film is reduced and its handling ability is reduced when it is smaller than this range.

(Chain Length Controlling Agent)

Examples of the monoisocyanate to be used for the chain length control include phenyl isocyanate, tolyl isocyanate, naphthyl isocyanate, isopropylphenyl isocyanate, methoxyphenyl isocyanate, chlorophenyl isocyanate, an alkyl isocyanate having from 1 to 10 carbon atoms and the like.

Regarding the amount of such a monoisocyanate, it is desirable to use it in an amount of from 1 to 10 mols based on 100 mols of the total isocyanate. When the amount of monoisocyanate is smaller than this range, the molecular weight of the polycarbodiimide obtained becomes too large, thereby causing increase in the solution viscosity or solidification of the solution due to crosslinking reaction, and causing considerable reduction of storage stability of the polycarbodiimide solution. Also, when the amount of monoisocyanate is larger than the aforementioned range, solution viscosity of the polycarbodiimide obtained becomes so low that proper film formation cannot be achieved in molding a film by coating and drying the solution.

(Polymerization Catalyst)

As the catalyst to be used in the polycarbodiimide polymerization, various conventionally known catalysts for such a purpose can be used, and the preferred examples include 3-methyl-1-phenyl-2-phosphorene-1-oxide, 1-phenyl-2-phosphorene-1-oxide, 1-phenyl-2-phosphorene-1-sulfide, 1-ethyl-3-methyl-2-phosphorene-1-oxide, 3-methyl-1-phenyl-1-phosphor-3-cyclopentene-1-oxide, 2,5-dihydro-3-methyl-1-phenylphosphor-1-oxide and the like. In addition, triphenylphosphine oxide, tritolylphosphine oxide, bis(oxadiphenylphosphino)ethane and the like phosphine oxides may be used.

The amount of the catalyst is from 0.001 to 5 mol %, preferably from 0.1 to 2 mol %, based on the total amount of isocyanate components. When using amount of the catalyst is smaller than this range, the polymerization requires too long period of time which is not practical, and when it is larger than this on the contrary, the reaction becomes so quick that the solution is solidified into a gel shape during the reaction or a product having considerably reduced storage stability is obtained.

(Polymerization Temperature)

Polymerization temperature at the time of the production of polycarbodiimide is 100° C. or less, preferably 70° C. or less, more preferably from 0 to 60° C. and most preferably from 30 to 50° C. when the polymerization temperature is higher than the above range, the structure of polycarbodiimide of formula (1) cannot be obtained, tolylene diisocyanate alone is polymerized and the aliphatic isocyanate remains unreacted, so that a hardened product of interest having high flexibility cannot be obtained. In addition, since the isocyanate functional group remains in the polycarbodiimide solution, stability of the solution is low.

That is, when the number of the structural unit derived from tolylene diisocyanate in the molecule of the polycarbodiimide to be used in the adhesive film of the invention is defined as m, and the number of the structural unit derived from an aliphatic isocyanate having from 1 to 18 carbon atoms is defined as n, m is an integer of from 2 to 1,000, n is an integer of from 1 to 500, m+n is from 3 to 1,500, n/(m+n) is from $\frac{1}{1500}$ to $\frac{1}{3}$, and the structural unit of formula (2) does not continue. Such a structure is obtained by the aforementioned reaction temperature. The phrase "the structural unit of formula (2) does not continue" means that the structural unit of formula (2) does not continue substantially.

The polycarbodiimide preferably has a weight average molecular weight of from 3000 to 10000, more preferably from 4000 to 8000.

(Polymerization Solvent)

In producing the polycarbodiimide copolymer, a polycarbodiimide solution is obtained by carrying out carbodiimide formation reaction in an aprotic organic solvent. Examples of such an aprotic organic solvent include toluene, xylene, an alkyl toluene having from 3 to 5 carbon atoms, benzene, an alkyl benzene having from 3 to 36 carbon atoms, naphthalene, tetrahydrofuran, dioxane, acetone, butanone, cyclohexanone, N-methylpyrrolidone, N,N-dimethylformamide, N,N-dimethylacetamide and the like. These solvents may be used alone or as a mixture of two or more. In addition, a component which is not concerned in the reaction may be mixed therein.

In producing the polycarbodiimide, it is desirable to adjust the amount of solvent to such a level that concentration of the polycarbodiimide in the solution becomes from 1 to 90% by weight. When the polymer concentration exceeds 90% by weight, viscosity becomes high and storage stability of the solution also becomes poor. On the other hand, the polymer concentration lower than the above range is not practical, because it is necessary to remove a large volume of solvent in molding the obtained polymer.

(Production of Adhesive Film)

For producing the adhesive film of the invention, the aforementioned polycarbodiimide copolymer varnish is made into a film having an appropriate thickness using a conventionally known method (casting, spin coating, roll coating or the like). The film thus formed is dried generally at a temperature necessary for removing the solvent. That is, in order to effect the drying without progressing the hardening reaction so quickly, the coating temperature is set to a range of generally from 20 to 350° C., preferably from 50 to 250° C., most preferably from 70 to 200° C. The drying temperature lower than this range is not desirable, because the solvent remains in the film so that reliability of the film becomes poor. Also, when the drying temperature is higher than the above range, heat curing of the film is apt to progress.

The thickness of the adhesive film for underfill is not particularly limited and may be arbitrary set within the range that fills the space between the semiconductor element and the wiring circuit substrate but does not interfere the electrical connection between the electrodes for connection. The thickness may be generally from 5 $\mu$m to 200 $\mu$m, more preferably from 5 to 120 $\mu$m.

In producing the adhesive film, a fine inorganic filler may be formulated within such a range that its workability and heat resistance are not spoiled. Also, in order to give surface smoothness, various additives such as a lubricant, a leveling agent, a degassing agent and the like may be added as occasion demands. Their mixing amount is from 0.1 to 100 parts by weight, preferably from 0.2 to 50 parts by weight, based on 100 parts by weight of the copolymer.

In addition, in order to improve adhesive strength, various additives such as a silane coupling agent, a titanium coupling agent, a nonionic surface active agent, a fluorine surface active agent, a silicone additive agent and the like may be added to the adhesive film as occasion demands.

In order to effect improvement of thermal conductivity, regulation of elastic modulus and the like, for example, one or two or more of aluminum, copper, silver, gold, nickel, chromium, lead, tin, zinc, palladium, solder and the like metals, or alloy, alumina, silica, magnesia, silicon nitride or the like ceramic, and other various inorganic powders comprising carbon and the like may be adhered in producing the adhesive film as occasion demands.

In addition, these films may be arranged on a support to form a laminated adhesive sheet. In order to produce such a laminated adhesive sheet, the aforementioned polycarbodiimide varnish may be coated on a support, or a film may be formed in advance and then laminated on a support using a press or the like.

As the aforementioned support, a metal foil, an insulating film and the like can be exemplified. As the metal foil, any one of aluminum, copper, silver, gold, nickel, indium, chromium, lead, tin, zinc, palladium and the like may be used, and these may be used alone or as an alloy. Also, as the insulating film, any film of, polyimide, polyester, polyethylene terephthalate and the like having heat resistance and chemical resistance can be used.

Regarding the aforementioned metal foil and insulating film, they may be used alone, or a two layer material such as a metal foil/insulating film in which both of them are laminated in two or more layers may be used. As such a two layer material, a copper/polyimide two layer material and the like can be exemplified.

In carrying out the sealing operation, the adhesive film for underfill obtained in this manner can be subjected to a hardening treatment in the following manner. That is, by heating the sheet shape sealing material obtained by the aforementioned method at a temperature of from 100 to 225° C., preferably from 120 to 200° C., for a period of from 3 to 300 minutes, preferably from 5 to 180 minutes, its hardening is generated and sealing of a semiconductor device can be carried out.

Next, the method for carrying out sealing of a semiconductor device by the adhesive film of the invention is described further in detail based on an illustrative example with reference to the drawings.

Figure 2:
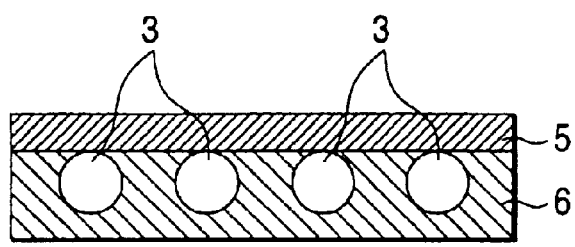
FIG. 2 is a schematic sectional view showing an illustrative example of the production process of semiconductor device shown in FIG. 1.
Figure 3:
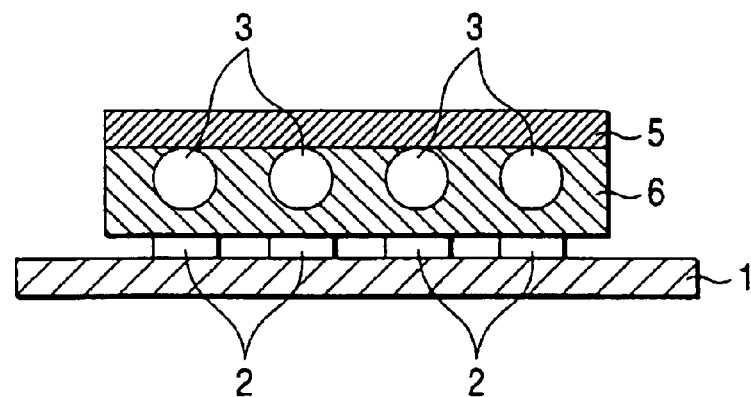
FIG. 3 is a schematic sectional view showing an illustrative example of the production process of semiconductor device shown in FIG. 1.

Firstly, as shown in FIG. 2, a semiconductor element 5 to which an adhesive film 6 for underfill is applied is arranged at a fixed position on a wiring circuit substrate 1 on which an electrode part 2 for connection is arranged (cf. FIG. 3). Next, by heating and compressing this, the adhesive film 6 for underfill between both of the electrode parts 2 and 3 for connection is extruded by heating and melting it, and electrical connection and fixation of the wiring circuit substrate 1 and semiconductor element 5 are achieved by carrying out electrical connection of the aforementioned electrode parts 2 and 3 and simultaneously forming a sealing resin layer 4 by hardening the melted adhesive film 6 for underfill (cf. FIG. 1).

In this manner, as shown in FIG. 1, a semiconductor device having a face down structure is obtained, in which a semiconductor element is mounted on a wiring circuit substrate via an electrode part for connection arranged on the wiring circuit substrate and another electrode part for connection arranged on the semiconductor element, and the gap between the wiring circuit substrate and semiconductor element is sealed by the sealing resin layer 4 of the adhesive film.

Figure 4:
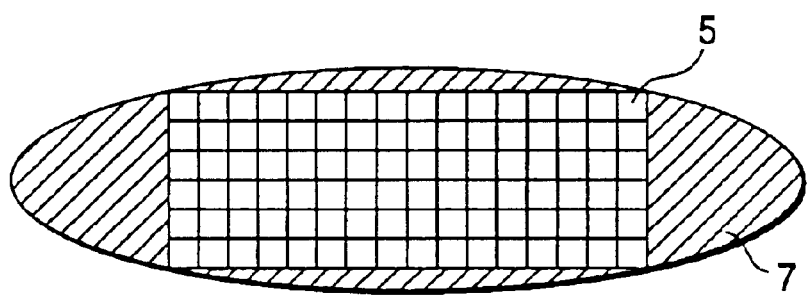
FIG. 4 is a schematic illustration showing two or more semiconductor elements formed on a semiconductor wafer.

In this connection, application of the adhesive film 6 for underfill to the semiconductor element 5 may be carried out before slicing the semiconductor element 5 from the semiconductor wafer 7 shown in FIG. 4, or after the slicing.

Figure 5:
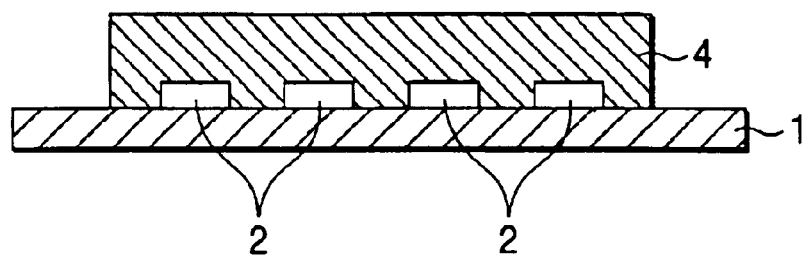
FIG. 5 is a schematic sectional view showing another illustrative example of the production process of semiconductor device shown in FIG. 1.

In addition, contrary to the aforementioned method, the sealing may be carried out by mounting the adhesive film 6 for underfill on the wiring circuit substrate 1 on which two or more electrode parts 2 for connection are arranged as shown in FIG. 5, via the electrode parts 2 for connection. The semiconductor element 5 arranged with the electrode part 3 for connection is arranged on a fixed position of such a circuit substrate. Next, electrical connection and fixation of the wiring circuit substrate 1 and semiconductor element 5 are carried out by melt-extruding the adhesive film between both of the electrode parts 2 and 3 for connection through its heating and compression and simultaneously forming a sealing resin layer 4 by hardening the melted adhesive film 6. The semiconductor device shown in FIG. 1 can also be obtained by this method in the same manner as described in the foregoing.

The size of the adhesive film 6 for underfill may be optionally set depending on the size (area) of the semiconductor element 5 to be mounted, but in general, it is desirable to set it to almost the same size (area) of the semiconductor element 5.

Though the thickness of the adhesive film for underfill is not particularly limited, it may be optionally set within such a range that it can fill the gap between the semiconductor element and wiring circuit substrate and it does not hinder electrical connection between the electrode parts for connection, which is generally from 5 to 200 $\mu$m, preferably from 10 to 120 $\mu$m.

In filling gap between the semiconductor element and the wiring circuit substrate with the adhesive film for underfill, it is desirable to carry out compression. Conditions for such a compression can be optionally set based on the materials, numbers and the like of the electrode parts 2 and 3 for connection and temperature, but it is desirably within the range of generally from 0.098 to 4.9 N/number, preferably from 0.196 to 2.94 N/number.

Though the method for the production of a semiconductor device has been described in the foregoing based on a physical relationship in which the wiring circuit substrate 1 is arranged downside and the semiconductor element 5 is mounted on its upper side, the production method is not limited thereto and it may have the opposite physical relationship, that is, the semiconductor element 5 is arranged downside and the wiring circuit substrate 1 is mounted on its upper side.

EXAMPLES

Next, the invention is described further illustratively based on Example and Comparative Example. Production of polymers was carried out all in a stream of nitrogen. In this connection, characteristics of the obtained polycarbodiimide were measured as follows.

IR

This was measured using FT/IR-230 (mfd. by JEOL).

Modulus of Tensile Elasticity (E')

This was measured using a dynamic viscoelasticity apparatus DMS 210 (mfd. by Seiko Instruments & Electronics). Each adhesive film for underfill was cured at 175° C. for 5 hours and subjected to the measurement.

Glass Transition Temperature (Tg)

This was measured using an apparatus for thermomechanical analysis TMA SS/100 (mfd. by Seiko Instruments & Electronics). Each adhesive film for underfill was cured at 175° C. for 5 hours and subjected to the measurement.

Gel Time

Gel time at 175° C. was measured using a gel time tester (mfd. by Nisshin Kagaku).

Next, this invention is described further illustratively with reference to Examples.

A 12.9 g (74.1 mmol) portion of TDI (a mixture of 2,4-TDI 80% and 2,6-TDI 20%), 111.26 g (444.6 mmol) of 4,4'-diphenylmethane diisocyanate, 31.15 g (148.2 mmol) of naphthalene diisocyanate, 12.46 g (74.1 mmol) of hexamethylene diisocyanate, 12.54 g (74.1 mmol) of 1-naphthyl isocyanate and 202.56 g of toluene were mixed. At 40° C., 0.71 g (3.705 mmol) of 3-methyl-1-phenyl-2-phosphorene-2-oxide was added thereto, and the mixture was stirred for 2 hours. After confirming progress of the reaction by infrared analysis, the reaction mixture was adjusted to a temperature of 100° C. and maintained at this temperature for 2 hours. Progress of the reaction was confirmed by infrared analysis. Illustratively, decrease in the absorption of N—C—O stretching vibration (2270 cm-1) of isocyanate and increase in the absorption of N—C—N stretching vibration (2135 cm$^{-1}$) of carbodiimide were observed.

The thus produced varnish was coated on a separator (50 μm in thickness) comprising a form oil-treated polyethylene terephthalate film using a laminator (coating speed 1 m/min, drying temperature 130° C.×1 min→150° C.×1 min), thereby obtaining an adhesive film for underfill (thickness of the adhesive film, 25 m). Its glass transition temperature Tg was 213° C., modulus of tensile elasticity E' (35° C.) was 2600 MPa and gel time (175° C.) was 21 s.

Using the adhesive film for underfill obtained in this manner, a semiconductor device was produced in accordance with the aforementioned semiconductor device production method. That is, as shown in FIG. 2, the adhesive film 6 was applied at 90° C. to a semiconductor element 5 (thickness: 150 μm, size: 8 mm×8 mm) which had been arranged with an electrode part 3 for connection (material: Au stud bump, height: 50 μm, 91 bump/chip, peripheral). Next, as shown in FIG. 3, a wiring circuit substrate 1 (a flexible print substrate of 40 μm in thickness) arranged with a Cu wiring (L/S=100 μm/100 μm, height 18 μm, electroless Ni/Au plating treatment) was mounted on a fixed position of the adhesive film 6. Thereafter, the adhesive film was heat-melted using a flip chip bonder (DB 100 mfd. by Shibuya Kogyo) under a condition of heating temperature (tool 180° C., stage 100° C.)×load 15 kgf/the number of electrodes×60 s. By filling the gap between the wiring circuit substrate 1 and the semiconductor element 5 with the molten state resin to generate temporary fixation and effect connection of the aforementioned both electrode parts 2 and 3 for connection at the same time, a total of 10 semiconductor devices in which the gap was resin-sealed with the underfill adhesive film layer 4 were obtained.

COMPARATIVE EXAMPLE

A 205.85 g (1,182 mmol) portion of tolylene diisocyanate was mixed with 155.66 g of toluene. This was stirred at 50° C. for 1 hour, and then 20 g (118.2 mmol) of 1-naphthyl isocyanate and 2.27 g (11.82 mmol) of 3-methyl-1-phenyl-2-phosphorene-2-oxide was added thereto, and the mixture was heated to 100° C. while stirring and further maintained for 2 hours. Progress of the reaction was confirmed by infrared analysis. Illustratively, decrease in the absorption of N—C—O stretching vibration (2270 cm$^-$1) of isocyanate and increase in the absorption of N—C—N stretching vibration (2135 cm$^-$1) of carbodiimide were observed. Also, absorption of C—O stretching vibration (1695 cm$^-$1) of amido group of the binding part was observed.

An adhesive film for underfill was obtained in the same manner as in Example 1, except that this varnish was used. Its glass transition temperature Tg was 195° C., modulus of tensile elasticity E' (35° C.) was 3240 MPa and gel time (175° C.) was 53 s. Also, semiconductor devices were prepared in the same manner as in Example 1.

Initial energizing test was carried out at 25° C. on all of the semiconductor devices obtained in the above Example and Comparative Example. Thereafter, the semiconductor devices from which conductivity was obtained were after-cured (175° C.×5 hr) and then subjected to the electricity passing test at 25° C. In the electricity passing test, those having infinite value of resistance (disconnection) were counted as defectives. The results are shown in Table 1.

TABLE 1

|  | Example | Comparative Example |
|---|---|---|
| Modulus of tensile elasticity E' (MPa) | 2600 | 3240 |
| Glass transition temperature Tg (° C.) | 213 | 195 |
| Gel time (s) | 21 | 53 |
| Initial value of resistance (Ω) (mean value of n = 10) | 3.5 | 20.0 |
| Electricity passing test after aftercure (the number of defectives/10 devices) | 0/10 | 10/10 |

As is evident from Table 1, the semiconductor devices obtained in the Example showed low initial value of resistance after mounting and generated no defectives in the electricity passing test after after-cure. Contrary to this, the semiconductor devices obtained in the Comparative Example showed high initial value of resistance after mounting and generated defectives in all of the samples in the electricity passing test after after-cure. Thus, stable current is secured when the mounting is carried out using the adhesive film of the present invention, because the sealing resin layer generates sufficient hardening under such a state that electrodes of the semiconductor element and wiring circuit substrate are mutually contacted.

Since the adhesive film for underfill of the invention is a quickly hardening type, it quickly forms a highly heat resistant sealing resin layer between the wiring circuit substrate and the semiconductor element of a semiconductor device. The arrangement of such an underfill layer renders possible relaxation of stresses generating in the wiring circuit substrate, semiconductor element and electrode parts for connection, and it also improves reduction of warping of the wiring circuit substrate and semiconductor element, prevention of crack generation in the semiconductor element and reliability of the electric connection of the electrode part for connection arranged on the wiring circuit substrate with the electrode part for connection arranged on the semiconductor element.

While the invention has been described in detail and with reference to specific embodiments thereof, it will be apparent to one skilled in the art that various changes and modifications can be made therein without departing from the scope thereof.

This application is based on Japanese patent application No. 2002-330422 filed Nov. 14, 2002, the entire contents thereof being hereby incorporated by reference.

What is claimed is:

1. An adhesive film for underfill comprising a polycarbodiimide, said polycarbodiimide is a colpolymer comprising:

a structural unit represented by the following formula (1);

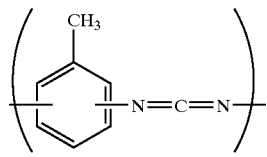

and a structural unit represented by the following formula (2),

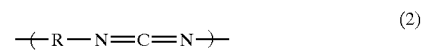

wherein R represents an alkylene group having from 1 to 18 carbon atoms, and a terminal structural unit derived from a monoisocyanate on both termini of said polycarbodiimide, wherein the number "m" of the structural unit represented by the formula (1) is an integer of from 2 to 1,000, the number "n" of the structural unit represented by the formula (2) is an integer of from 1 to 500, and wherein m+n is from 3 to 1,500, n/(m+n) is from $1/1{,}500$ to $1/3$, and the structural unit of formula (2) does not continue.

2. The adhesive film for underfill according to claim 1, wherein the polycarbodiimide is obtained in an aprotic organic solvent at a reaction temperature of from 0 to 60° C.

3. A semiconductor device which comprises a semiconductor element, a wiring circuit substrate, and a resin formed from the adhesive film of claim 1, which fills the gap between said semiconductor element and said wiring circuit substrate.

4. A semiconductor device which comprises a semiconductor element, a wiring circuit substrate, and a resin formed from the adhesive film of claim 2, which fills the gap between said semiconductor element and said wiring circuit substrate.

* * * * *